US009836384B2

(12) United States Patent
Leinfellner et al.

(10) Patent No.: US 9,836,384 B2
(45) Date of Patent: Dec. 5, 2017

(54) TESTING DEVICE FOR REAL-TIME TESTING OF A VIRTUAL CONTROL UNIT

(71) Applicant: dSPACE digital signal processing and control engineering GmbH, Paderborn (DE)

(72) Inventors: Robert Leinfellner, Paderborn (DE); Timo Kerstan, Gechingen (DE)

(73) Assignee: dSPACE digital signal processing and control engineering GmbH, Paderborn (DE)

(*) Notice: Subject to any disclaimer, the term of this patent is extended or adjusted under 35 U.S.C. 154(b) by 330 days.

(21) Appl. No.: 14/490,173

(22) Filed: Sep. 18, 2014

(65) Prior Publication Data
US 2015/0082289 A1    Mar. 19, 2015

(30) Foreign Application Priority Data

Sep. 18, 2013    (EP) .................................... 13184920

(51) Int. Cl.
*G06F 11/36*    (2006.01)
*G05B 17/02*    (2006.01)
(Continued)

(52) U.S. Cl.
CPC .......... *G06F 11/3664* (2013.01); *G05B 17/02* (2013.01); *G06F 11/261* (2013.01);
(Continued)

(58) Field of Classification Search
None
See application file for complete search history.

(56) References Cited

U.S. PATENT DOCUMENTS 8,768,681 B2 *    7/2014    Kajitani ................. G05B 17/02
                                                      703/23
9,147,016 B2    9/2015    Matsumura et al.
(Continued)

FOREIGN PATENT DOCUMENTS

CN        1981250 A        6/2007
CN    103098032 A        5/2013
(Continued)

OTHER PUBLICATIONS

"Conservative Application-Level Performance Analysis through Simulation of MPSoCs"; Andrew Nelson et al. ESTIMedia 2010; 978-1-4244-9086-8/10.
(Continued)

*Primary Examiner* — Isaac T Tecklu
(74) *Attorney, Agent, or Firm* — Muncy, Geissler, Olds & Lowe, P.C.

(57)    ABSTRACT

A testing device for real-time testing of at least a part of a virtual electronic control unit with an electronic control unit code is provided. The testing device has a computing unit of a first type, and a computing unit of a second type. The testing of a virtual electronic control unit with electronic control unit code, which is executable on the computing unit of the second type with a second instruction set, is made possible in that a computing unit of the first type executes an emulator for emulating the computing unit of the second type and the emulator executes the electronic control unit code. The emulator also has a simulation environment interface for exchanging data and/or events with the simulation environment.

14 Claims, 5 Drawing Sheets

(51) Int. Cl.
  *G06F 17/50* (2006.01)
  *G06F 11/26* (2006.01)

(52) U.S. Cl.
  CPC ...... *G06F 11/3688* (2013.01); *G06F 17/5009* (2013.01); *G06F 17/5095* (2013.01); *G05B 2219/23445* (2013.01)

(56) References Cited

U.S. PATENT DOCUMENTS

| | | | | |
|---|---|---|---|---|
| 2004/0221273 | A1* | 11/2004 | Sandham | G06F 9/45504 717/134 |
| 2008/0229165 | A1* | 9/2008 | Foster | G06F 11/3664 714/731 |
| 2008/0319730 | A1* | 12/2008 | Clark | G06F 17/5022 703/19 |
| 2009/0281779 | A1* | 11/2009 | Kajitani | G05B 17/02 703/7 |
| 2009/0306952 | A1* | 12/2009 | Kajitani | G06F 17/5022 703/13 |
| 2009/0312850 | A1* | 12/2009 | Higuchi | G05B 17/02 700/29 |
| 2013/0151220 | A1* | 6/2013 | Matsumura | G06F 17/5009 703/7 |
| 2013/0185034 | A1* | 7/2013 | Murase | G06F 17/5009 703/2 |
| 2013/0212554 | A1* | 8/2013 | Maeda | G06F 8/35 717/105 |
| 2013/0275114 | A1* | 10/2013 | Morishima | G06F 9/455 703/26 |

FOREIGN PATENT DOCUMENTS

| | | |
|---|---|---|
| EP | 2 608 040 A1 | 6/2013 |
| GB | 2 485 136 A | 6/2012 |
| JP | 2000-259445 A | 9/2000 |
| JP | 2001-101031 A | 4/2001 |
| JP | 2008-262318 A | 10/2008 |
| JP | 2013-084163 A | 5/2013 |

OTHER PUBLICATIONS

"Modelisation of a distributed hardware system for accurate simulation of real-time applications"; Mikaël Briday et al.; IRCCyN, UMR CNRS 6597; Copyright c 2003 IFAC.

"Chip simulation of automotive ECUs"; Jakob Mauss et al.; 9. Symposium Steuerungssysteme für automobile Antriebe, Sep. 20, 2012 and Sep. 21, 2012, Berlin.

"Chip simulation of automotive ECUs"; Jakob Mauss et al.; QTronic Simulation for Engineering; 9. Symposium Steuerungssysteme für automobile Antriebe, Sep. 20, 2012 and Sep. 21, 2012, Berlin.

"A Mixed Level Simulation Environment for Stepwise RTOS Software Refinement"; Markus Becker et al.; University of Paderborn/C-LAB;.

"Study of the techniques for emulation programming"; Victor Moya del Barrio; Computer Science Engenieering—FIB UPC; Jun. 18, 2001.

"Instruction set simulator": Wikipedia; Aug. 23, 2013.

"QEMU"; Wikipedia; Aug. 23, 2013.

"Virtual Validation with Dspace—Early PC-Based Validation of ECU Software"; dSPACE GmbH; Jan. 2013.

"Tools to Build, Distribute and Use Virtual Prototypes and VDKs"; Synopsys Virtualizer; 2012 Synopsys, Inc.

"Automotives Powertrain Control of System; Chip simulation of automotives ecus"; Nietschke et al.; Sep. 21, 2012; pp. 129-136, XP055100591, Renningen; ISBN 978-3-81-693155-3.

Japanese Office Action for Japanese Application No. 2014-190138 dated Aug. 1, 2016 with English translation.

Chinese Office Action for Chinese Application No. 201410468167.0 dated May 10, 2017 with English translation.

* cited by examiner

TESTING DEVICE FOR REAL-TIME TESTING OF A VIRTUAL CONTROL UNIT

This nonprovisional application claims priority under 35 U.S.C. §119(a) to European Patent Application No. EP 13184920.0, which was filed on Sep. 18, 2013, and which is herein incorporated by reference.

BACKGROUND OF THE INVENTION

Field of the Invention

The invention relates to a testing device for real-time testing of at least a part of a virtual electronic control unit with an electronic control unit code. The testing device has at least one computing unit of a first type with a first instruction set and at least one simulation environment for real-time simulation of the environment of the virtual electronic control unit; and the simulation environment and the electronic control unit code are computed with at least one computing unit of the first type.

Description of the Background Art

The above-mentioned testing devices are known from the conventional art in the field of electronic control unit development and are used in research and development and many application areas are in the automotive sector and aerospace engineering.

The testing devices for real-time testing of a virtual electronic control unit are conceptually based on the testing devices used for testing a real electronic control unit. Such testing devices are used to carry out so-called hardware-in-the-loop tests (HIL tests) of real electronic control units or of a group of real electronic control units whose interaction is to be tested. In this context, real electronic control units are real-time capable microcomputers that are used to influence a technical process. Real electronic control units therefore have a computing unit on which a real-time-capable operating system is executed, with the aid of which regulating and/or controlling sampled data systems—of the kind that have been known for decades in systems theory—are implemented. Real electronic control units act via an I/O interface (input/output) on the process that is to be influenced and receive technical measurement information about the process via the I/O interface. The testing of a real electronic control unit with the aid of an HIL simulator is the last step of the testing of a real electronic control unit before it is used in its actual operational environment. The real electronic control unit can, for example, be an engine electronic control unit of an internal combustion engine.

For the real-time testing of the real electronic control unit, the real electronic control unit is connected via its I/O interfaces to the testing device. A simulation environment, which can also simulate the environment of the real electronic control unit in real time, is operated on the testing device, which is equipped with a computing unit or a plurality of computing units of the first type. In the case of the above-mentioned example of an engine control unit, then, this is the real-time simulation of the internal combustion engine, for example. In light of the foregoing, the real-time capability of the testing device is essential for the testing because ultimately, the purpose of the testing is to find out whether the electronic control unit will prove to be valuable under real-time conditions, i.e. whether the implemented algorithms, for example, can be computed within the required sampling intervals, etc.

The HIL-Simulation of real electronic control units clearly has the advantage that the behavior of real electronic control units can be safely tested in a simulated environment. Also clear, however, is the disadvantage that the real electronic control unit as such must actually be present in order to be able to carry out the test. This is disadvantageous because the development of an electronic control unit that can be used in a series production context involves significant effort and costs. If the fact that the real electronic control unit does not fulfill certain requirements is only revealed when the real electronic control unit is tested, then it is not uncommon for this to require significant efforts that go far beyond a simple "rectification;" in the worst-case scenario, the concept of the electronic control unit must be completely reassessed, practically requiring the real electronic control unit to be developed all over again; as a result, scheduling-related and cost-related planning objectives cannot be met.

In order to combat this problem, i.e. in order to permit known components of the electronic control unit, which is to be tested, to be included in a function test as early as possible, the concept of the so-called virtual electronic control unit has been devised ("Virtual Validation with dSPACE: Early PC-Based Validation of ECU Software," dSPACE product information, 2013). In this case, the electronic control unit does not in fact have to be physically present, but the electronic control unit code must be in a hardware-independent high-level language (e.g. C/C++, Assembler). The electronic control unit code in this case is translated into the first instruction set of the computing unit of the first type so that the electronic control unit code can be executed on the testing device with the computing unit of the first type. As a rule, the processor/computing unit implementation of the testing devices is different from that of the electronic control unit to be tested. In a PC-based testing device, for example, Intel processors, which have a corresponding instruction set (e.g. Intel IA32), are used as the computing units of the first type, whereas electronic control units are most often microcontroller-based, i.e. have a computing unit of a second type, which is different from a computing unit of the first type and has a second instruction set that is different from the first instruction set (e.g. C166 instruction set of the C166 microcontroller family).

The operating method outlined above has the disadvantage that the original electronic control unit code that is actually executable for a computing unit of the second type is not tested by the testing device, but instead only the translation of the electronic control unit code to the first instruction set of the computing unit of the first type belonging to the testing device. Another problem is that the electronic control unit code for implementing the outlined operating method must actually be in a high-level language so that it can be translated into a particular instruction set. In many specific applications, though, this requirement is not or cannot be fulfilled, for example because of a need to maintain secrecy about implementation details.

SUMMARY OF THE INVENTION

It is therefore an object of the present invention to provide a testing device for real-time testing of a virtual electronic control unit with an electronic control unit code, which avoids the above-mentioned disadvantages of real-time testing devices on which the invention is based.

In an embodiment, the invention provides a testing device in that the electronic control unit code is executable on a computing unit of a second type with a second instruction set, where the second instruction set of the computing unit of the second type is different from the first instruction set of the computing unit of a first type. In addition, a computing unit of the first type executes an emulator for emulating the second computing unit, with the emulator executing the electronic control unit code. Further, the emulator can have a simulation environment interface for exchanging data and/or events with the simulation environment.

With the testing device according to the invention, it is possible to execute the electronic control unit code in its original form with the testing device; there is no need to translate the control device code from a high-level language into the first instruction set of the first computing unit that is a component of the testing device. The executability of the electronic control unit code, which is only executable on a computing unit of the second type with a second instruction set, becomes possible through the use of an emulator for emulating the second computing unit, with the emulator itself being executed on a computing unit of the first type. The emulator is thus the link between the computing unit of the second type, i.e. the computing unit of the electronic control unit to be tested, and the computing unit of the first type belonging to the testing device.

The simulation environment interface of the emulator is of great importance; through this interface, data and/or events can be exchanged with the simulation environment, for example states of pins of the I/O interface of the electronic control unit—both originating from the emulated electronic control unit as an input value of the simulation environment, and originating from the simulation environment as input values of the emulated electronic control unit—and for example trigger signals on interrupt lines, etc. The simulation environment interface is of particular importance because it permits the synchronization and synchronizability of the execution of the emulation of the electronic control unit and of the electronic control unit code on the emulator on the one hand and the execution of the simulation environment and therefore of the real-time simulation of the environment of the virtual electronic control unit on the other. The simulation environment interface is thus also a requirement for the real-time execution of the electronic control unit code by the emulator on a computing unit of the first type.

It is quite possible for the testing device to have a plurality of computing units of the first type so that the simulation environment is executed, for example, on one computing unit of the first type and the emulator is executed on another computing unit of the first type.

In an embodiment of the invention, the simulation environment includes at least one simulator and a process model; the simulator can be called by the emulator via the simulation environment interface and/or conversely, the emulator can be called by the simulator via the simulation environment interface. This makes it possible for the emulator and the emulation of the electronic control unit code to react to events, for example events from the real-time simulation of the environment of the virtual control unit. This connection between the simulation environment and the electronic control unit code can take place, for example, based on the physical context of the emulated electronic control unit or by means of interface routines; the physical context describes the physical connections and registers of the emulated control unit, such as the interrupt lines. Through the use of interface routines, when an event occurs, a predetermined function within the electronic control unit code is executed by the emulator. The determination of this function can be implemented in an automated fashion with the aid of symbol tables and a description as to which interface routines are available in the control unit.

If the simulation environment includes a simulator and a process model, data and/or events can be exchanged between the emulator and the process model via the simulation environment interface. In other words, the testing device according to the invention is embodied so that when the simulator calls the emulator via the simulation environment interface, the emulator records the execution context of the electronic control unit code, the emulator executes the part of the electronic control unit code affected by the call, and the emulator updates the execution context of the electronic control unit code. The execution context describes all boundary conditions on which the execution of the electronic control unit code on the emulator depends—in addition to internal state variables, also those state variables that describe the interface of the emulated electronic control unit and that may also be influenced by the simulation environment.

The testing device can be embodied so that the electronic control unit code is complete, in particular, it includes the operating system, drivers, and all software components of the electronic control unit so that the above-mentioned execution context describes the entire physical context of the virtual control unit. Under these circumstances, the testing of the virtual electronic control unit includes practically all aspects of the real electronic control unit corresponding to the virtual control unit. Alternatively, however, the testing device can also include those specific applications in which the electronic control unit code is incomplete; in particular, it does not include the operating system and drivers of the electronic control unit so that the execution context includes only software components of the virtual control unit.

The computation of the electronic control unit code by the emulator can occur in a data-driven fashion via the simulation environment interface between the emulator and the simulation environment, in particular between the emulator and the process model. This mechanism also enables a synchronization of the execution of the electronic control unit code by the emulator with the computation of the simulation environment and/or of the process model of the simulation environment.

The simulation environment can include at least one simulator and a process model; the simulator can be called by the process model and/or the process model can be called by the simulator. In this case, the testing device can be embodied so that the computation of the process model and the execution of the electronic control unit code by the emulator are controlled centrally by the simulator so that in this way, the desired synchronous execution is achieved, particularly the timing coordination of the computation of the process model with the execution of the electronic control unit code.

Regardless of which of the above-described methods is used to achieve synchronization between the real-time computation of the process model and the execution of the electronic control unit code by the emulator, there is naturally an interest in executing the electronic control unit code on the emulator in an optimally timed fashion so that the computations that come up in each sampling interval can also be completed without interruption—within this interval, in any case—and do not violate the real-time requirement merely due to a limitation that arises here. All known measures and techniques can be used in order to optimize the runtime behavior. Furthermore, in the case of the interpretation of the electronic control unit code, care can be taken that memory reservations relating to the runtime are reduced or avoided altogether. In the case of the binary translation of the electronic control unit code, a suitable measure could lie in the fact that all atomic-level code blocks are identified a priori and translated before the runtime. Alternatively, the block cache is selected to be large enough that after an initialization phase, all of the code blocks required for the simulation have been translated and as a result, no further displacements occur in the block cache. Another measure can lie in identifying and eliminating chain references in the electronic control unit code.

A method is also provided that provides a testing device for real-time testing of at least a part of a virtual electronic control unit with an electronic control unit code and is used as a departure point. The testing device can have at least one computing unit of the first type with a first instruction set and at least one simulation environment for simulating the environment of the virtual control unit. According to an embodiment, the simulation environment and the electronic control unit code can be computed with at least one computing unit of the first type. According to this provision, the electronic control unit code is prepared so that it can be executed on a computing unit of the second type with a second instruction set. The computing unit of the second type can be the computing unit of the series-production electronic control unit to be tested. In this respect, the second instruction set of the computing unit of the second type is different from the first instruction set of the computing unit of the first type. According to an embodiment of the method, an emulator for emulating the second computing unit can be executed on a computing unit of the first type belonging to the testing device and the emulator in turn executes the electronic control unit code. According to an embodiment of the invention, data and/or events can be exchanged between the emulator and the simulation environment, with the possibility of signal flow in both directions. In other words, data and/or events can be conveyed from the emulator in the direction of the simulation environment and also from the simulation environment in the direction of the emulator. In very general terms, the operating method according to the invention makes it possible to synchronize the real-time simulation of the environment of the virtual electronic control unit with the emulation of the electronic control unit code, so that the emulator also executes the electronic control unit code in real time.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
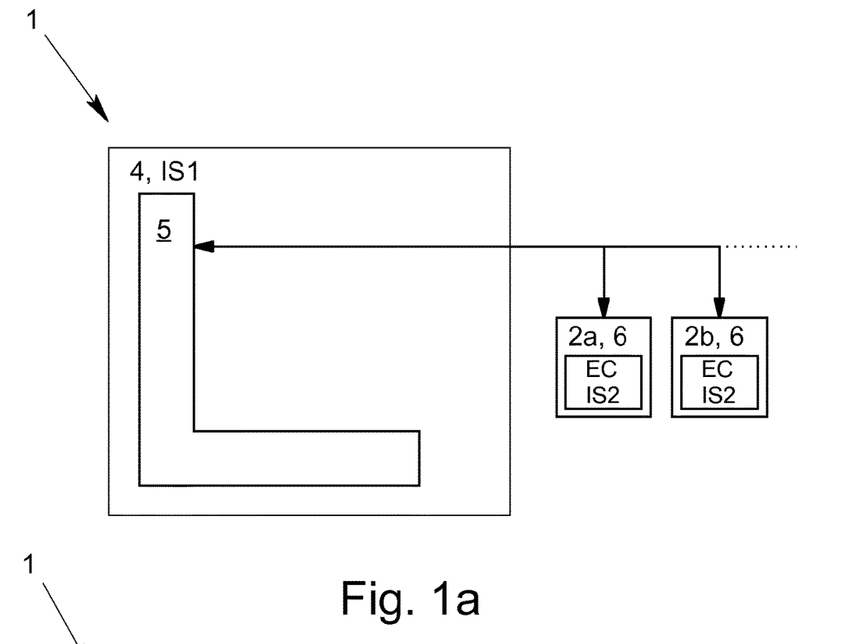
FIG. 1a shows a testing device with real electronic control units to be tested.
Figure 1B:
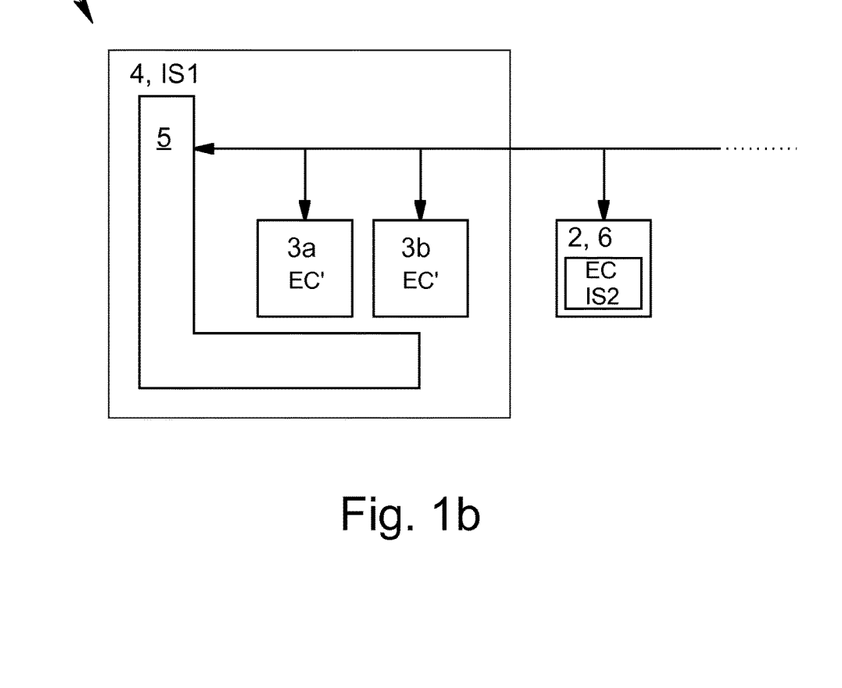
FIG. 1b shows a testing device with real and virtual electronic control units to be tested.

FIG. 1a schematically depicts a testing device 1 known from the prior art for real-time testing of real electronic control units 2a, 2b. FIG. 1b on the other hand shows a testing device 1 known from the prior art, which in addition to the real electronic control units 2 to be tested, also has two virtual electronic control units 3a, 3b to be tested. The testing devices 1 have a computing unit 4 of the first type auf, which is characterized by means of a first instruction set IS1. The testing devices 1 shown in FIGS. 1a and 1b also have a simulation environment 5 for real-time simulation of the environment of the electronic control unit to be tested. The real electronic control units 2, i.e. the ones that are physically present, have a computing unit 6 of the second type; this computing unit 6 of the second type is characterized by means of a second instruction set IS2. In the examples shown, the second instruction set IS2 of the computing unit 6 of the second type of the electronic control units is different from the first instruction set IS1 of the computing unit 4 of the first type belonging to the testing device 1.

In FIGS. 1a and 1b, the testing device 1 is PC-based; in the example shown, the first instruction set IS1 is compatible with the Intel 32-bit x86 architecture (IA-32). The computing units 6 of the second type are microcontrollers with computing units of type C166 so that the second instruction set IS2 relating to them is in any case different from the first instruction set IS1 of the computing unit 4 of the first type belonging to the testing device 1. The real electronic control units 2 are connected via their physical interface to a corresponding physical I/O interface of the testing device 1.

In the case of a real-time testing of real electronic control units 2 according to FIG. 1a, the electronic control unit code EC can easily be executed in its original form, i.e. can be tailored to the second instruction set IS2 of the computing unit 6 of the second type. The testing of the electronic control unit code EC of the real electronic control unit 2, however, requires that the real electronic control unit 2 actually be physically present, which entails the disadvantages described above.

The testing device 1 according to FIG. 1b functions—also—with virtual electronic control units 3a, 3b. These electronic control units are not physically present; instead, they are implemented in that the electronic control unit code EC is translated into the first instruction set IS1 of the computing unit 4 of the first type belonging to the testing device 1 so that the translated electronic control unit code EC' is executable on the testing device 1. This does in fact enable early testing of the electronic control unit code without requiring the presence of a real control unit, but has the disadvantage that instead of the original electronic control unit code EC, the translated variant EC' is tested. In addition, the electronic control unit code EC must be in a high-level language in order to even permit the translation into the first instruction set IS1 of the computing unit 4 of the first type.

Figure 2A:
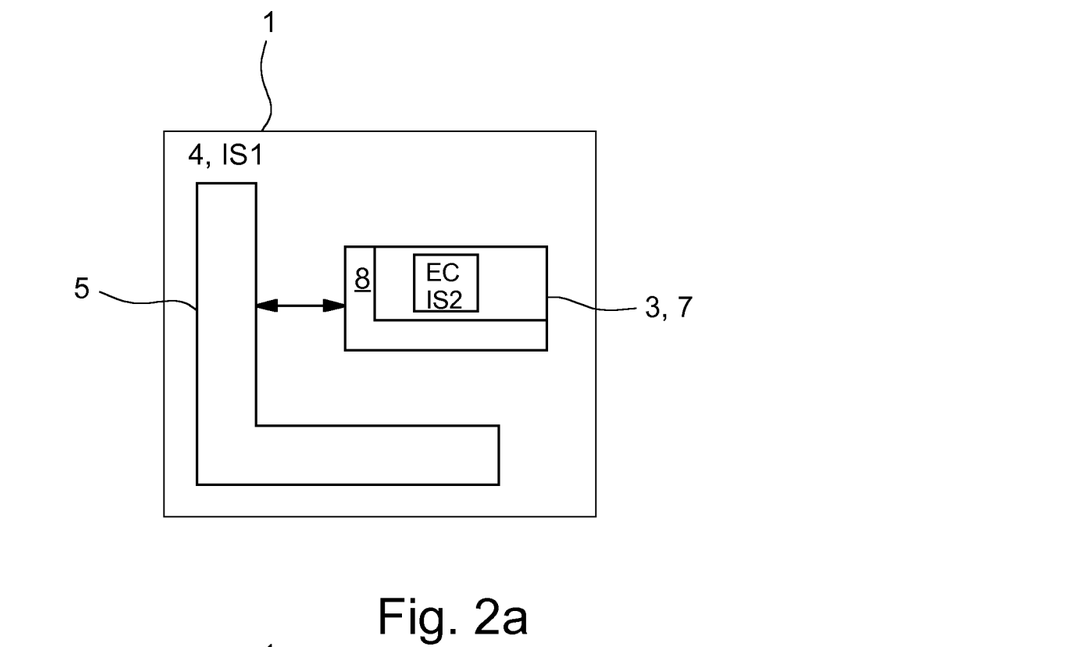
FIG. 2a shows an exemplary embodiment of a testing device according to the invention, with a virtual control unit.
Figure 2B:
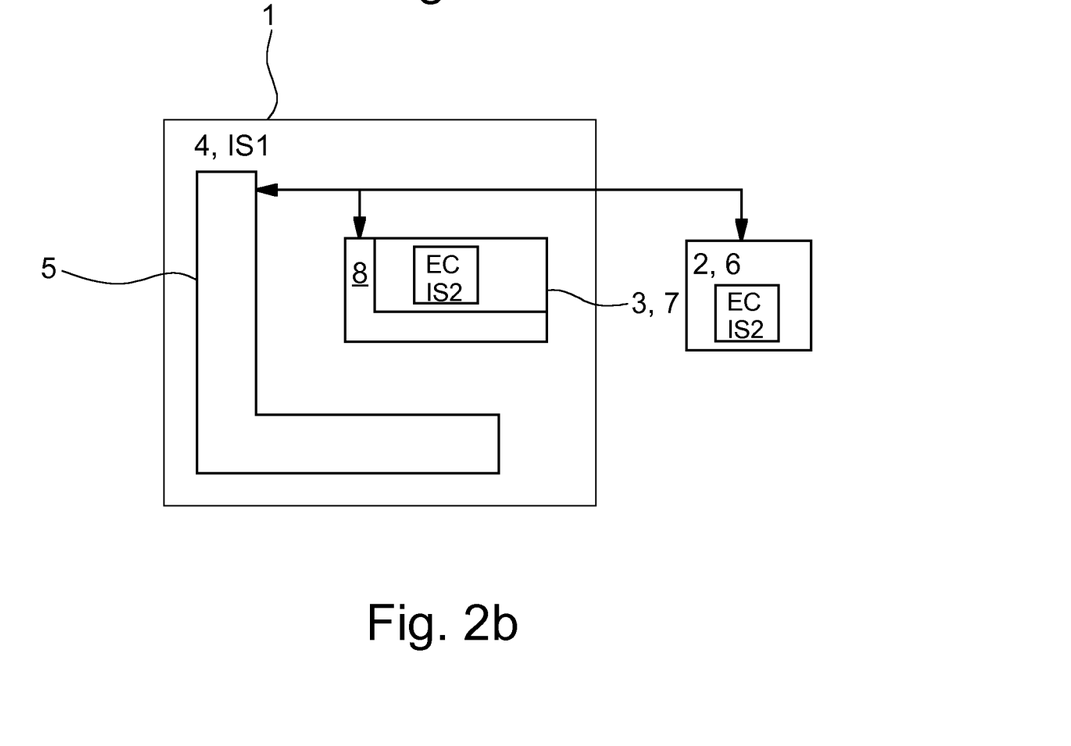
FIG. 2b shows the exemplary embodiment according to FIG. 1a, with a combination of virtual and real electronic control units.

Then, FIGS. 2a, 2b show a testing device 1 according to the invention. Here, too, the testing device 1 has a computing unit 4 of the first type with a first instruction set IS1; here, too, a simulation environment 5 is used for real-time simulation of the environment of the virtual electronic control unit 3. The electronic control unit code EC of the virtual electronic control unit 3 here also ultimately performs computations with the aid of the computing unit 4 of the first type, but there is a large difference between it and the testing devices known from the prior art—for example the one according to FIGS. 1a and 1b. The electronic control unit code EC of the virtual electronic control unit 3 is executable on a computing unit of the second type with a second instruction set IS2, with the second instruction set IS2 being different from the first instruction set IS1 of the computing unit 4 of the first type belonging to the testing device 1. All the same, the electronic control unit code EC actually intended for the computing unit of the second type can be executed with the testing device 1 since the computing unit 4 of the first type belonging to the testing device 1 executes an emulator 7; this emulator 7 emulates the computing unit of the second type and the emulated computing unit of the second type executes the electronic control unit code. This measure makes it unnecessary for the electronic control unit code EC, which is executable on a computing unit of the second type with a second instruction set IS2, to be translated into the first instruction set IS1; it is basically possible to execute the original electronic control unit code EC, which as a rule, is created for a piece of target hardware other than that of the testing device 1. There is no longer the requirement for the electronic control unit code EC to be in a high-level language in order to permit a translation into the first instruction set IS1 of the testing device.

It is important that the emulator 7 has a simulation environment interface 8 via which the emulator 7 can exchange data and/or events with the simulation environment 5. With this functionality, the simulation environment interface 8 is essential to the use of the emulator 7 in the context of a real-time simulation since the simulation environment interface 8 enables a synchronization of the real-time simulation of the environment of the virtual electronic control unit 3 and the emulation of the computing unit of the second type by the emulator 7.

FIG. 2b shows that the testing device 1 according to the invention is not limited to testing only a virtual electronic control unit 3 or a plurality of virtual electronic control units 3; instead, it is also possible to use the testing device 1 with external real electronic control units 2. The exemplary embodiment shown in FIG. 2b of the simultaneous testing of virtual electronic control units 3 and real electronic control units 2 or of a mixed group of electronic control units can be a frequently used application of the testing device 1 explained above.

Figure 3:
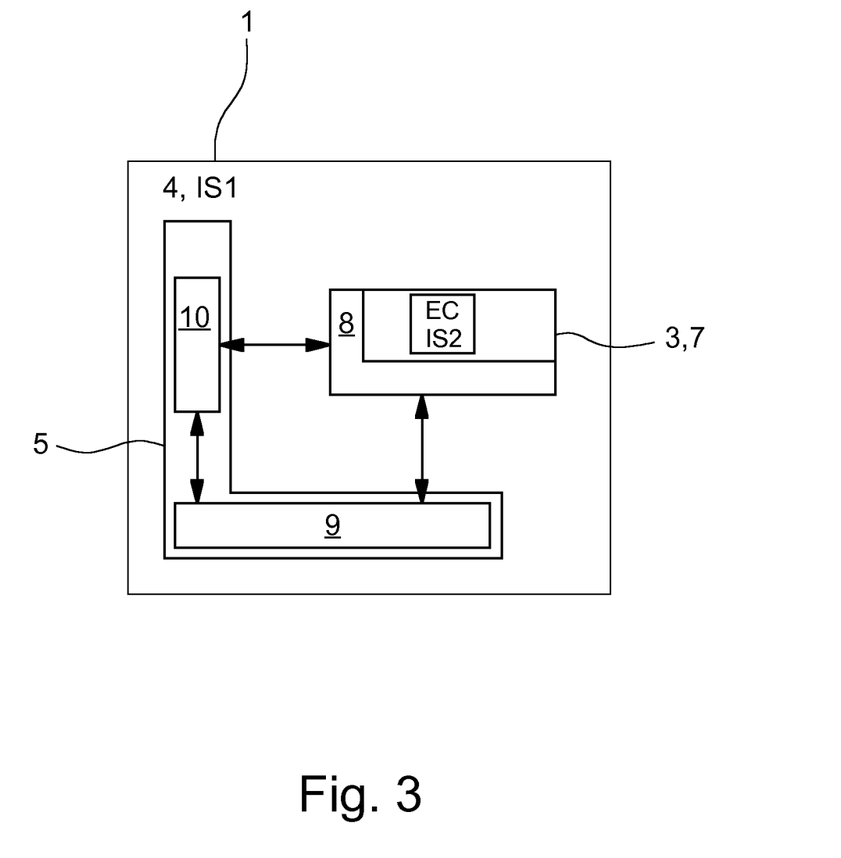
FIG. 3 shows an exemplary embodiment of a testing device according to the invention.

FIG. 3 shows the testing device 1 in which the simulation environment 5 includes a simulator 9 and a process model 10. The simulator 9 can be called by the emulator 7 via the simulation environment interface 8 and conversely, the emulator 7 can be called by the simulator 9 via the simulation environment interface 8. All in all, the simulator 9 is a real-time-capable platform for executing the process model 10 while taking real-time conditions into account. In addition to a real-time environment, the simulator also has suitable numerical methods that enable computation of the process model 10. The simulator 9 thus coordinates the timing of the execution of various tasks of the process model 10 and provides resources for also being able to take non-periodic events into account in the simulation.

FIG. 3 also shows that data can be exchanged between the emulator 7 and the process model 10 via the simulation environment interface 8. For this purpose, the process model 10 has information from the interfaces of the emulated virtual control unit 3 so that there is a data-based interlocking relationship between the process model 10 and the emulated virtual electronic control unit 3.

Figure 4:
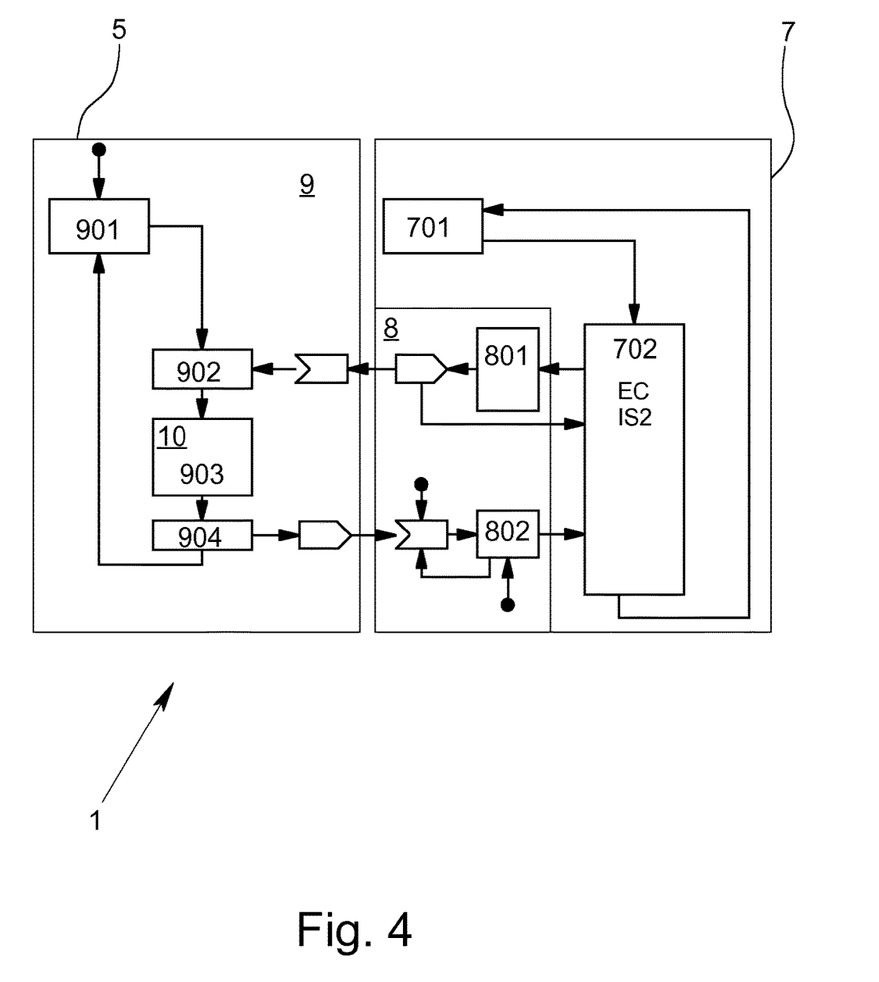
FIG. 4 shows an exemplary embodiment of a testing device according to the invention, with a data-driven emulator.
Figure 5:
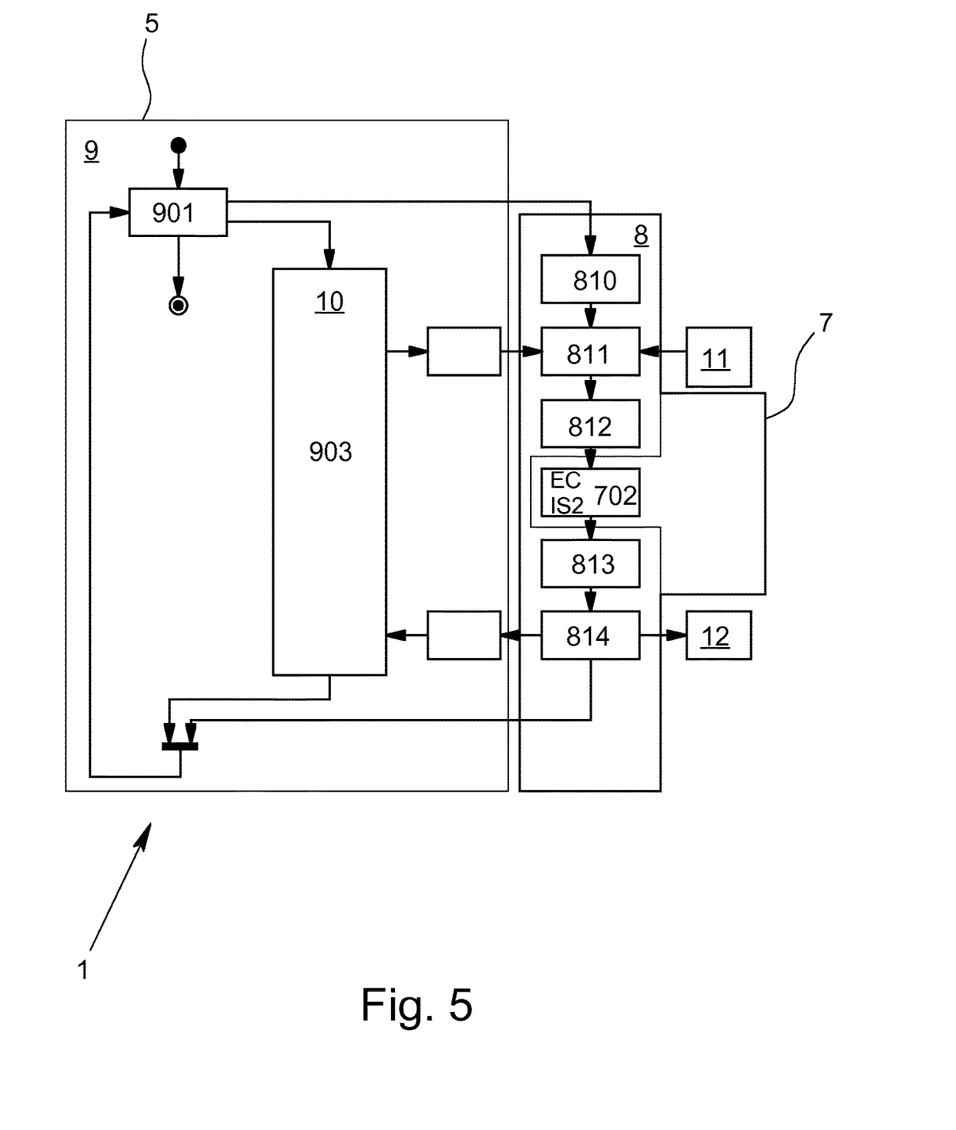
FIG. 5 shows an exemplary embodiment of a testing device according to the invention, with an emulator controlled by a simulator.

FIGS. 4 and 5 show testing devices 1 according to the invention; the block circuit diagrams are intended to show not only the structures of the testing devices 1, but also operational sequences inside the testing devices 1. Both depictions show the simulation environment 5 opposite the emulator 7 with the simulation environment interface 8, via which the simulation environment 5 interacts with the emulator 7. The respective simulator 9 with the process model 10 is also shown in each simulation environment 5.

FIG. 4 shows that data can be exchanged between the emulator 7 and the process model 10 via the simulation environment interface 8. The exemplary embodiment according to FIG. 4 is characterized in that the execution of the electronic control unit code EC by the emulator 7 occurs in a data-driven fashion via the simulation environment interface 8 between the emulator 7 and the process model 10. The simulation environment interface 8 is therefore used to detect whether of-interest state variables of the process model 10 and thus for example signals on particular channels of the interface have changed, whereupon corresponding actions in the emulator 7 are triggered.

Starting from the rest state 901 of the simulator 9, a first computation step for the process model 10 is triggered. To this end, relevant electronic control unit data computed by the emulator 7 are read in an input routine 902.

In this case, the computations on the emulator 7 likewise start from a rest state 701; the emulator 7 is executed in step 702. The state 702 can be achieved through various types of triggering. The state 702 can, for example, be achieved by means of a timer interrupt—starting from the rest state 701—or by means of a data event. In the case of a data event, the sequence first switches to the state 802 and in the event that an interrupt is connected to it, then the sequence switches to the state 702. This is the case, for example, if a pin change interrupt is connected to an I/O pin. If no interrupt is connected to the I/O pin, then the sequence switches back out of state 802 and no further action occurs in 702. State 802 then makes sure that the data for the emulator are in appropriately coded form, i.e. in the execution context of the emulator.

The emulator also executes the electronic control unit code EC that is in the second instruction set 152. The simulator 9 and the emulator 7 run practically in parallel. The emulation is only interrupted—as explained above—in the event of an interrupt connected to an event; otherwise, all that happens is that data to be reciprocally exchanged are made available via the simulation environment interface 8 and read by the emulator 7 and simulator 9, respectively.

After completion of a computation step 903 of the process model 10, the current state variables of the process model 10 are made available to the emulator in the output function 904. This occurs in the simulation environment interface 8 in block 802 either through simple storage of the physical context of the emulator 7 or through a calling up of corresponding interface functions in the electronic control unit code EC. The expression "storage of the physical context" should be understood here to mean that for example changed I/O signals are made available to the emulator through suitable storage of the changed I/O signals in the context of the emulator. The calling up of an interface function in the electronic control unit code EC in step 702, however, is only carried out if the use of such an interface function is appropriately configured and an interrupt in the electronic control unit code EC has been triggered. If no interrupt is connected, then all that happens—as explained above—is that the information as such is made available. In the present context, this means that the signal is physically present and as such, has been made available for use through suitable storage and can be used through a corresponding simple reading procedure; however, no steps in block 702 are triggered. The same is true for the computations 903 in the process model 10.

In the exemplary embodiment according to FIG. 5, the synchronization between the simulation environment 5 and the emulator 7 is achieved in that the computation of the process model 10 and the execution of the electronic control unit code EC by the emulator 7 are controlled centrally by the simulator 9, which in this case primarily relates to the coordination of the timing of the computation 903 of the process model 10 and the execution 702 of the electronic control unit code EC. FIG. 5 shows how, starting from the rest state 901 of the simulator, both the process model 10 and the execution of the emulator 7 are triggered via the simulation environment interface 8, which ensures the synchronization of the timing. This naturally requires that it be possible for the process model 10 to be called up by means of the simulator 9. On the emulator 7 side, in step 810, first the functionality of the electronic control unit that is to be operated is determined. Then in step 811, all of the current input values are read, both the input values that are made available by the process model 10 and other input values from possible external sources 11. In step 812, the execution context is established based on the physical data so that the information is available for the emulator 7 through a simple reading operation. In the case that interface routines are used, the processing of a corresponding function of the electronic control unit code EC by the emulator 7 occurs directly in step 702. After the computation is performed, the execution context with the updated data is then stored again in step 813 and through execution of the output function in step 814, corresponding outputs are described: on the one hand, outputs relating to the process model 10 and on the other hand, outputs that relate to external data sinks 12. In this way, the computation steps with regard to the process model 10 and with regard to the electronic control unit code EC are performed synchronously to each other—in real time—on the emulator 7.

In the exemplary embodiments according to FIGS. 4 and 5, the emulator 7 interprets each called-up command of the electronic control unit code EC in the second instruction set IS2 at runtime and then, on a computing unit of the first type belonging to the testing device 1, executes this called-up command in a way that is functionally identical to the corresponding command of the first instruction set IS1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A testing device for real-time testing of at least a part of a virtual electronic control unit with an electronic control unit code, the testing device comprising:

at least one computing unit of a first type with a first instruction set;

at least one simulation environment for real-time simulation of an environment of the virtual electronic control unit, the simulation environment and the electronic control unit code being computed with at least one computing unit of the first type; and a computing unit of a second type, the electronic control unit code being executable on the computing unit of the second type with a second instruction set, the second instruction set of the computing unit of the second type being different from the first instruction set of the computing unit of the first type, wherein the computing unit of the first type executes an emulator for emulating the computing unit of the second type, wherein the emulator executes the electronic control unit code, wherein the emulator has a simulation environment interface for sending and receiving data and/or events directly with the simulation environment, and wherein the electronic control unit code is directly executable in the emulator as the at least the part of the virtual electronic control unit without translation of the electronic control unit code into the first instruction set.

2. The testing device according to claim 1, wherein the simulation environment includes at least one simulator and a process model, wherein the simulator is called by the emulator via the simulation environment interface.

3. The testing device according to claim 2, wherein data is exchanged between the emulator and the process model via the simulation environment interface.

4. The testing device according to claim 2, wherein, when the emulator is called by the simulator via the simulation environment interface, the emulator records the execution context of the electronic control unit code, the emulator executes the part of the electronic control unit code affected by the call, and the emulator updates the execution context of the electronic control unit code.

5. The testing device according to claim 4, wherein the electronic control unit code is complete such that it includes an operating system, drivers, and all software components of the electronic control unit so that the execution context describes substantially the entire physical context of the virtual electronic control unit.

6. The testing device according to claim 4, wherein the electronic control unit code is incomplete such that it does not include the operating system and drivers of the electronic control unit so that the execution context includes only software components of the virtual electronic control unit.

7. The testing device according to claim 3, wherein a computation of the electronic control unit code by the emulator occurs in a data-driven fashion via the simulation environment interface between the emulator and the process model.

8. The testing device according to claim 2, wherein a computation of the process model and an execution of the electronic control unit code by the emulator are controlled centrally by the simulator, and wherein the process model includes a timing coordination of the computations of the process model and the execution of the electronic control unit code.

9. The testing device according to claim 1, wherein the emulator interprets each called-up command of the electronic control unit code in the second instruction set at runtime and then, on the computing unit of the first type, executes it such that is functionally identical to commands of the first instruction set.

10. The testing device according to claim 1, wherein the emulator translates all or part of the electronic control unit code into the first instruction set just before execution, and wherein, prior to a translation, as much memory is allocated for the electronic control unit code to be translated into the first instruction set as is actually available in the virtual electronic control unit.

11. The testing device according to claim 1, wherein the simulation environment includes at least one simulator and a process model, wherein the simulator is called by the emulator via the simulation environment interface and the emulator is called by the simulator via the simulation environment interface.

12. A virtual electronic control unit having an electronic control unit code, the virtual electronic control unit comprising:
a computing unit of a first type;
a computing unit of a second type, wherein the computing unit of the second type is emulated on the computing unit of the first type, the electronic control unit code executed on the computing unit of the second type with a second instruction set, the second instruction set of the computing unit of the second type being different from a first instruction set of the computing unit of the first type; and
at least one simulation environment for real-time simulation of inputs and outputs of the virtual electronic control unit, the simulation environment running on the computing unit of the first type,
wherein the computing unit of the first type executes an emulator for emulating the computing unit of the second type,
wherein the emulator executes the electronic control unit code,
wherein the emulator has a simulation environment interface for sending and receiving data and/or events directly from the inputs and outputs of the virtual electronic control unit to the simulation environment, and
wherein the electronic control unit code is executable in the emulator as the virtual electronic control unit without translation of the electronic control unit code into the first instruction set.

13. The testing device according to claim 1, wherein execution of the simulation environment is separate from execution of the electronic control unit code of the virtual electronic control unit.

14. The testing device according to claim 1, wherein the simulation environment code is separate from the electronic control unit code of the virtual electronic control unit.

* * * * *